(12) United States Patent
Nagao et al.

(10) Patent No.: US 6,252,758 B1
(45) Date of Patent: Jun. 26, 2001

(54) METHOD FOR REDUCING PARTICLES FROM AN ELECTROSTATIC CHUCK AND AN EQUIPMENT FOR MANUFACTURING A SEMICONDUCTOR

(75) Inventors: Mie Nagao, Chita; Ryusuke Ushikoshi, Tajimi; Masashi Ohno, Nagoya, all of (JP)

(73) Assignee: NGK Insulators, Ltd. (JP)

( * ) Notice: Subject to any disclaimer, the term of this patent is extended or adjusted under 35 U.S.C. 154(b) by 0 days.

(21) Appl. No.: 09/346,305

(22) Filed: Jul. 2, 1999

(30) Foreign Application Priority Data

Jul. 6, 1998 (JP) .................................................. 10-190350

(51) Int. Cl.[7] ........................ H01L 21/68; H02N 13/00; B23Q 3/15
(52) U.S. Cl. ........................... 361/234; 323/312; 279/128
(58) Field of Search ........................... 361/234, 233; 323/312; 374/161; 279/128; 118/666

(56) References Cited

U.S. PATENT DOCUMENTS

| | | | |
|---|---|---|---|
| 5,320,982 | * 6/1994 | Tsubone et al. | 279/128 |
| 5,746,928 | * 5/1998 | Yen et al. | 216/37 |
| 5,793,192 | * 8/1998 | Kubly et al. | 323/312 |
| 5,910,011 | * 6/1999 | Cruse | 438/16 |
| 6,084,763 | * 7/2000 | Hirano et al. | 361/234 |

FOREIGN PATENT DOCUMENTS

| | | |
|---|---|---|
| 59-181622 | * 11/1984 | (JP) . |
| 7-245336 | 9/1995 | (JP) . |
| 8-55900 | 2/1996 | (JP) . |
| 8-316297 | * 11/1996 | (JP) . |
| 11-67883 | * 3/1999 | (JP) . |
| 11-251418 | * 8/1999 | (JP) . |

* cited by examiner

Primary Examiner—Josie Ballato
Assistant Examiner—Roberto Rios
(74) Attorney, Agent, or Firm—Parkhurst & Wendel, LLP

(57) ABSTRACT

A method for reducing particles from an electrostatic chuck, having the steps of: setting a wafer onto an attracting face of an electrostatic chuck, attracting the wafer onto the attracting face by applying a voltage to the electrostatic chuck, releasing stress due to a difference in heat expansion between the wafer and the electrostatic chuck by sliding the wafer relative to the attracting face before the wafer's temperature arrives at a saturated temperature, and increasing the wafer's temperature to a saturated temperature from its lower temperature than that of the attracting face.

7 Claims, 5 Drawing Sheets

METHOD FOR REDUCING PARTICLES FROM AN ELECTROSTATIC CHUCK AND AN EQUIPMENT FOR MANUFACTURING A SEMICONDUCTOR

BACKGROUND OF THE INVENTION

1. Field of the Invention

This invention relates to a method for reducing particles from an electrostatic chuck and an equipment for manufacturing a semiconductor.

2. Related Art Statement

In each step of conveying a semiconductor wafer, exposure, film-forming by CVD, sputtering, etc., microprocessing, cleaning, etching, dicing, or the like, an electrostatic chuck is employed for attracting and holding the semiconductor wafer.

Particularly, from the views of using, as an etching gas or a cleaning gas, a halogen-based corrosive gas such as $ClF_3$, an equipment for manufacturing a semiconductor requires a high heat conduction for rapidly heating and cooling a semiconductor wafer with holding it and requires a high shock resistance not to be destroyed due to such a remarkably temperature change. Thus, a material made of dense aluminum nitride, dense alumina, or the like is promised.

On the other hand, inside the semiconductor-manufacturing equipment, the occurrence of particles, which results in defects of the semiconductor, is needed to be prevented. The particles are mainly generated from a backside surface of the semiconductor, a part of which stacks on the semiconductor wafer directly, the other part of which spreads out and stacks on a wall of a chamber. Then, the particles are peeled off of the wall, and thereby results in defects of a semiconductor.

In view of the above problems, JP A 7-245336 discloses a method in which convex-concave portions in an attracting face of an electrostatic chuck made of ceramic material are ground by irradiating a plasma and the fine protuberances of the convex-concave portions are removed, and thereby the occurrence of particles is reduced. The method is based on the finding of the cause of particles' occurrence that a silicon wafer having relatively low hardness is ground by the convex-concave portions when the silicon wafer contacts the convex-concave portions.

Moreover, JP A 8-55900 discloses a method in which a contacting shock of a silicon wafer with an electrostatic chuck is reduced by slowly rising a voltage to the electrostatic chuck when the silicon wafer is stuck to the electrostatic chuck, and thereby the particles' occurrence due to the convex-concave portions of the attracting face in the electrostatic chuck is decreased.

In a film-forming process such as a CVD or a sputtering, it is required to epitaxially grow a semiconductor film on a wafer, and thus, the wafer is required to be heated to a higher temperature range of not less than 100° C., particularly not less than 200° C. In that time, an attracting face of an electrostatic chuck is heated by a heater built-in the electrostatic chuck or a heater provided so as to be contacted with the electrostatic chuck in the lower side thereof.

In the electrostatic chuck, the wafer has a lower temperature when the wafer is stuck onto the attracting face of the electrostatic chuck, and the wafer has increasing temperature toward a saturated temperature with time past after attracting. The inventors found that, in such an electrostatic chuck or a semiconductor-manufacturing equipment, even though the contacting shock of the wafer with the electrostatic chuck just after attracting is relaxed and reduced, more particles than expectation occurs. It is difficult to reduce such particles as occurs with temperature rise of the wafer by a conventional method.

SUMMARY OF THE INVENTION

It is an object of the present invention to reduce such particles as occurs with a temperature rise of a wafer after setting the wafer onto an attracting face of an electrostatic chuck.

This invention relates to a method for reducing particles from an electrostatic chuck, comprising the steps of: setting a wafer onto an attracting face of an electrostatic chuck in a state that a temperature of the wafer is lower than that of the attracting chuck, attracting the wafer onto the attracting face by applying a voltage with the electrostatic chuck, releasing stress due to a difference in heat expansion between the wafer and the electrostatic chuck by sliding the wafer relative to the attracting face before the wafer's temperature arrives at a saturated temperature, and increasing the wafer's temperature to the saturated temperature from its lower temperature than that of the attracting face.

This invention also relates to a method for reducing particles from an electrostatic chuck, comprising the steps of: setting a wafer onto an attracting face of an electrostatic chuck, and attracting the wafer onto the attracting face by applying a pulsed voltage with the electrostatic chuck.

This invention further relates a method for reducing particles from an electrostatic chuck, comprising the steps of: setting a wafer onto an attracting face of an electrostatic chuck in a state that a temperature of the wafer is lower than that of the attracting face, and attracting the wafer onto the attracting face by applying a stepwise or continuously increasing voltage toward a saturated voltage with the electrostatic chuck.

This invention still further relate to a method for reducing particles from an electrostatic chuck, comprising the steps of: setting a wafer onto an attracting face of an electrostatic chuck, attracting the wafer into the attracting face by applying a voltage to the electrostatic chuck, and flowing a backside gas between the attracting face and the wafer when the voltage is applied to the electrostatic chuck.

This invention also relate to an equipment for manufacturing a semiconductor, comprising: an electrostatic chuck having an attracting face for setting a semiconductor wafer, a power supply for applying a voltage to the electrostatic chuck, and a backside gas-supplying equipment for flowing a backside gas between the attracting face and the wafer.

The inventors has studied to reduce particles as occurs with temperature rise of a wafer after attracting it onto an attracting face of an electrostatic chuck. Accordingly, they have got the following knowledge. That is, it has been conceived since before that the wafer have hardly stuck onto the attracting face of the electrostatic chuck made of ceramic material when the particles occur due to the shocks of the wafer colliding with the attracting face. Consequently, a means to reduce the shocks at the collision has been given. The inventors found, however, contrary to their expectations that the particles occur actually due to the difference of heat expansion between the wafer and the electrostatic chuck after the wafer is stuck onto the electrostatic chuck.

The inventors has, based on the above finding, found that a means, whereby the stresses due to the difference of the heat expansion between the wafer and the electrostatic chuck are released by sliding the wafer relative to the attracting face during the time of arriving at a given saturated temperature of the wafer from just attracting the wafer onto the electrostatic chuck, is adopted and thereby the particles are remarkably reduced.

The wording "saturated temperature" means a stable temperature of the wafer when a given heat value is afforded a system containing the wafer and the electrostatic chuck in a state that the wafer is stuck onto the electrostatic chuck with a given attracting power. Thus, when the desired attracting power or the heat value to the system changes, the saturated temperature change, too.

BRIEF DESCRIPTION OF THE DRAWINGS

For a better understanding of this invention, reference is made to the attached drawings, wherein.

DESCRIPTION OF THE PREFERRED EMBODIMENTS

If the temperature of the wafer increases at attracting, the difference of heat expansion between the wafer and the attracting face occurs. At that time, although a means to release the stress due to the difference of the heat expansion is not restricted, a means, in which the wafer is slid relative to the attracting face fundamentally by providing the step of decreasing the attracting power to the wafer, may be employed. The sliding can be observed with microscopic observation of the wafer's surface.

A means for reducing the attracting power to the wafer so as to cause the sliding after the attracting the wafer is begun is not restricted, the following means may be preferably used.

The means is to control an applied voltage with the electrostatic chuck. The concrete means is to apply a pulsed voltage with the electrostatic chuck. Thereby, the object of the present invention can be realized, and the temperature of the wafer can be increased during shorter time than that of only putting the wafer onto the electrostatic chuck, so that the treatment time of the wafer can be shorten.

Figure 1:
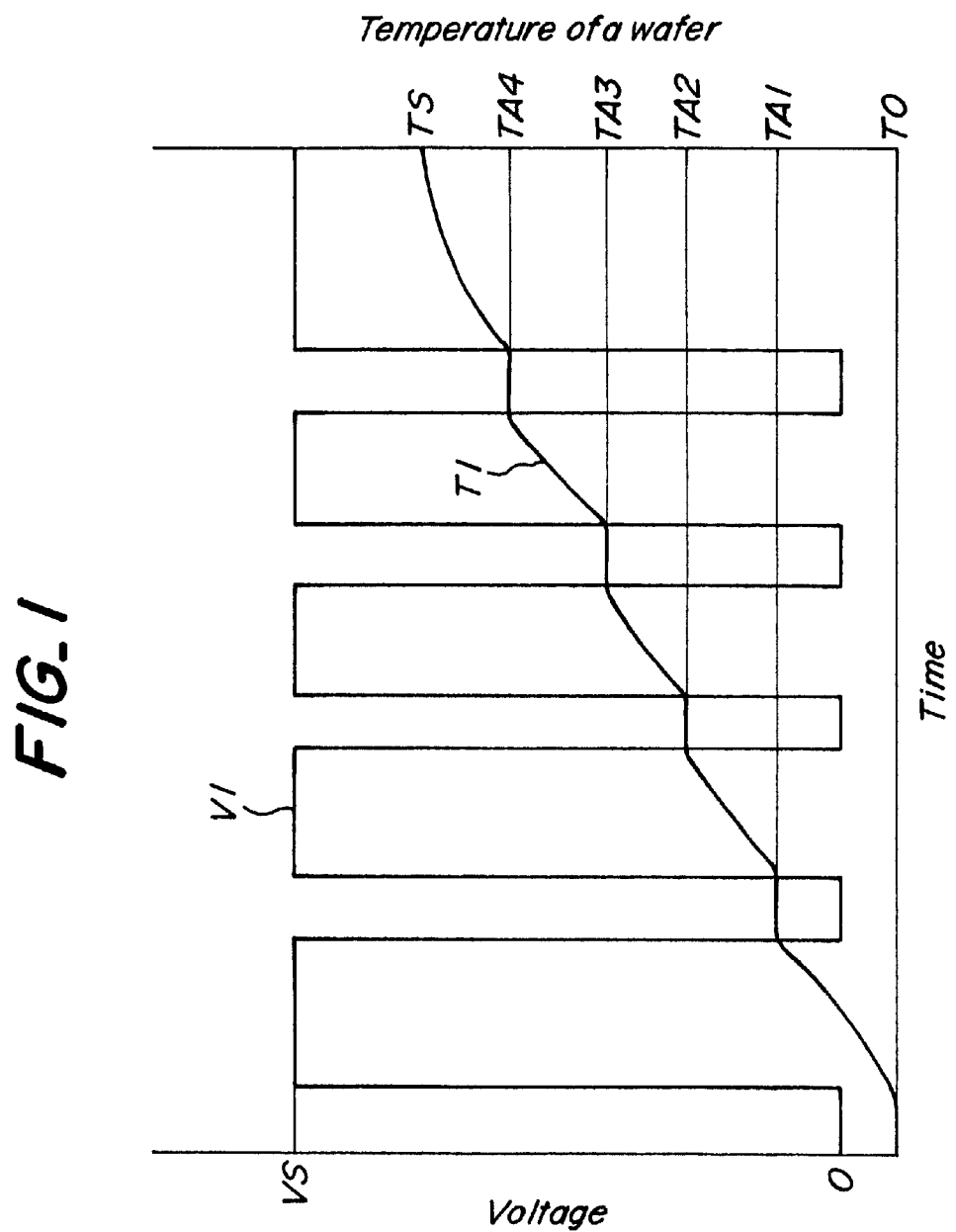
FIG. 1 is a graph showing, as an example, a voltage schedule V1 and a temperature schedule T1.

FIG. 1 shows schematically an example of an applied voltage pattern V1 and a temperature-rising schedule of the wafer, as a function of time past. In this method, a pulsed voltage between 0 and VS as a desired 10 voltage is applied. By applying the voltage VS, an attracting power enough to heat the wafer occurs and the temperature of the wafer is increased. When no voltage is applied, the temperature is almost constant. Moreover, since the attracting power vanishes when no voltage is applied, the wafer begin to slide relative to the attracting face and thereby the stress is released. If the wafer's temperature in each of stress releasing steps is denotes as TA1 to TA4, respectively and the saturated temperature is denoted as TS, the wafer's temperature difference between the successive stress releasing steps and the temperature difference between TA4 and TS in the last stress releasing step are preferably not more than 50° C. or below, more preferably not more than 46° C. or below.

A number of the pulse is not particularly limited, and a voltage values at high voltage applied and at low voltage applied are not restricted, but the voltage value at low voltage applied is preferably not more than the half of a desired voltage VS or below. Moreover, a negative biased voltage may be applied.

A voltage to be applied with the electrostatic chuck may be also increased continuously to the saturated temperature. In this case, since the object of the present invention is attained, and besides the wafer's temperature can be increased in a short time, the treatment time can be shorten.

Figure 2:
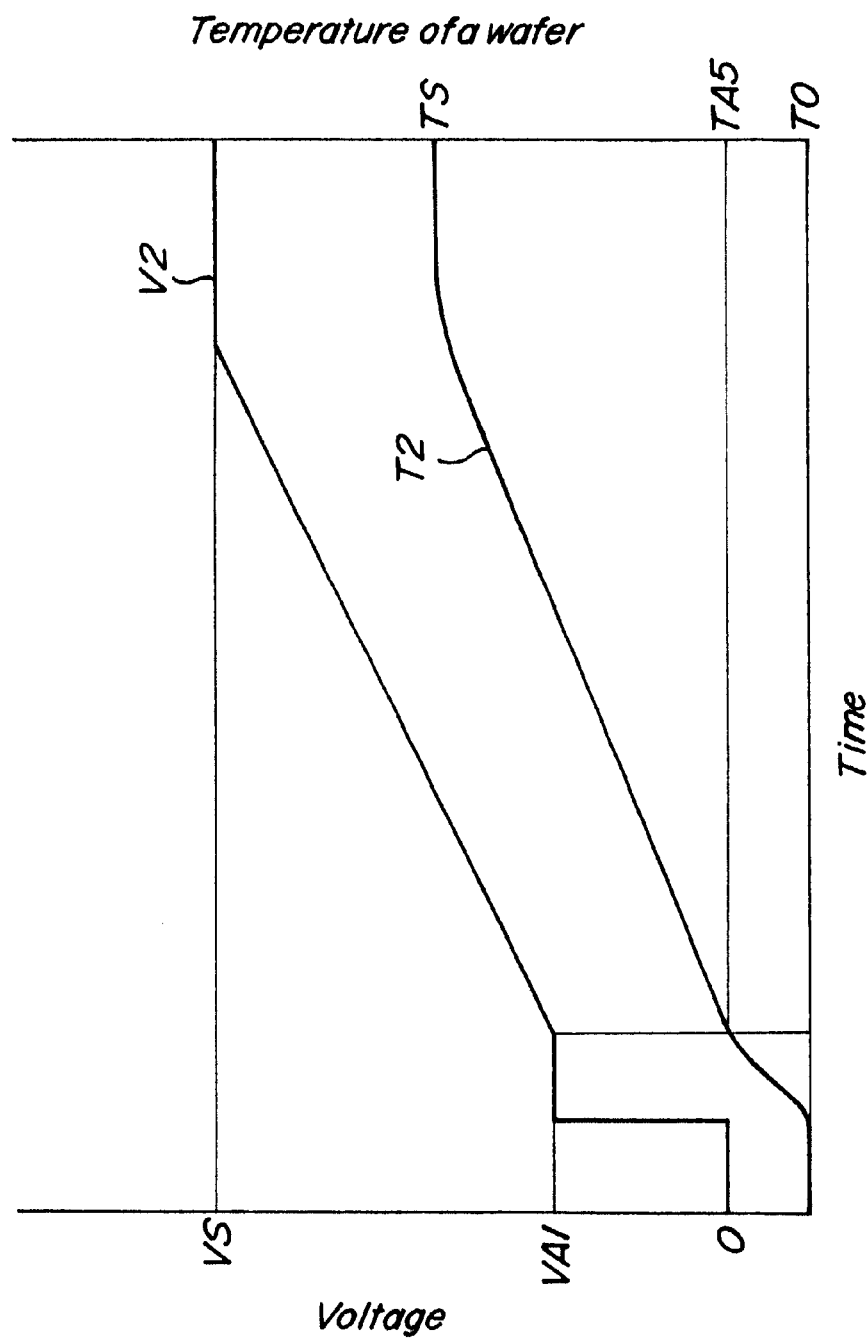
FIG. 2 is a graph showing, as an example, a voltage schedule V2 and a temperature schedule T2.

FIG. 2 schematically shows, as a function of time past, an example of an applied voltage pattern V2 and a rising schedule of the wafer's temperature in the above case. In this example, after low voltage VA1 is applied, a voltage increasing toward the desired voltage VS is applied. Applying the low voltage VA1, whereby the attracting power is increased and thereby the wafer is slid relative to the attracting face, is the stress releasing step. If first temperature of the wafer is denoted as TO and the temperature of the stress released step is denoted as TA5, the difference between TA5 and TS is preferably not more 50° C., more preferably not more than 46° C. Moreover, the value of the low voltage VA1 is preferably not more than the half of the desired voltage VS.

Figure 3:
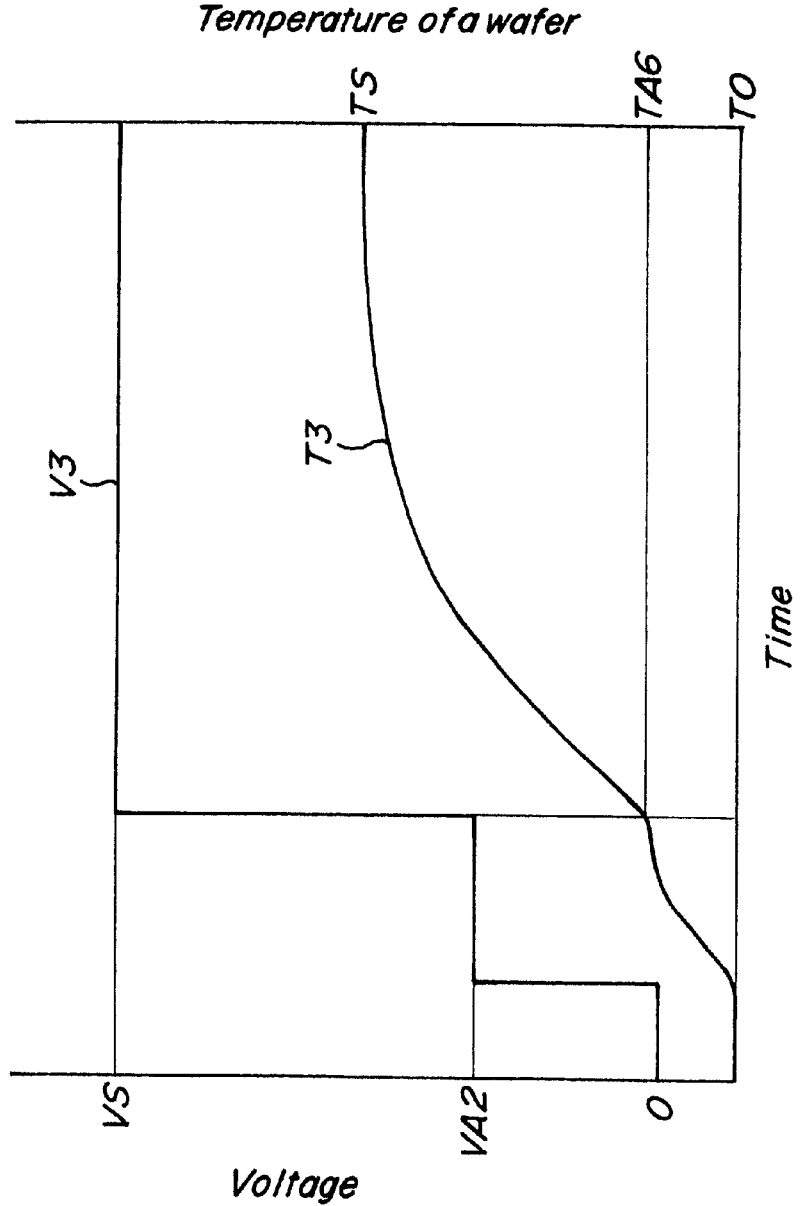
FIG. 3 is a graph showing, as an example, a voltage schedule V3 and a temperature schedule T3.

FIG. 3 schematically shows an example of an applied voltage pattern V3 and a rising schedule of the wafer's temperature, as a function of time past. In this example, after low voltage VA2 is applied, the desired voltage VS is applied. Applying the low voltage VA2, whereby the attracting power is decreased and the wafer is slid relative to the attracting face, is the stress releasing step. If first temperature of the wafer is denoted as TO and the temperature of the stress releasing step is denoted as TA6, the temperature difference between TA 6 and TS is preferably not more than 50° C. or below, more preferably not more than 46° C. or below.

Figure 4:
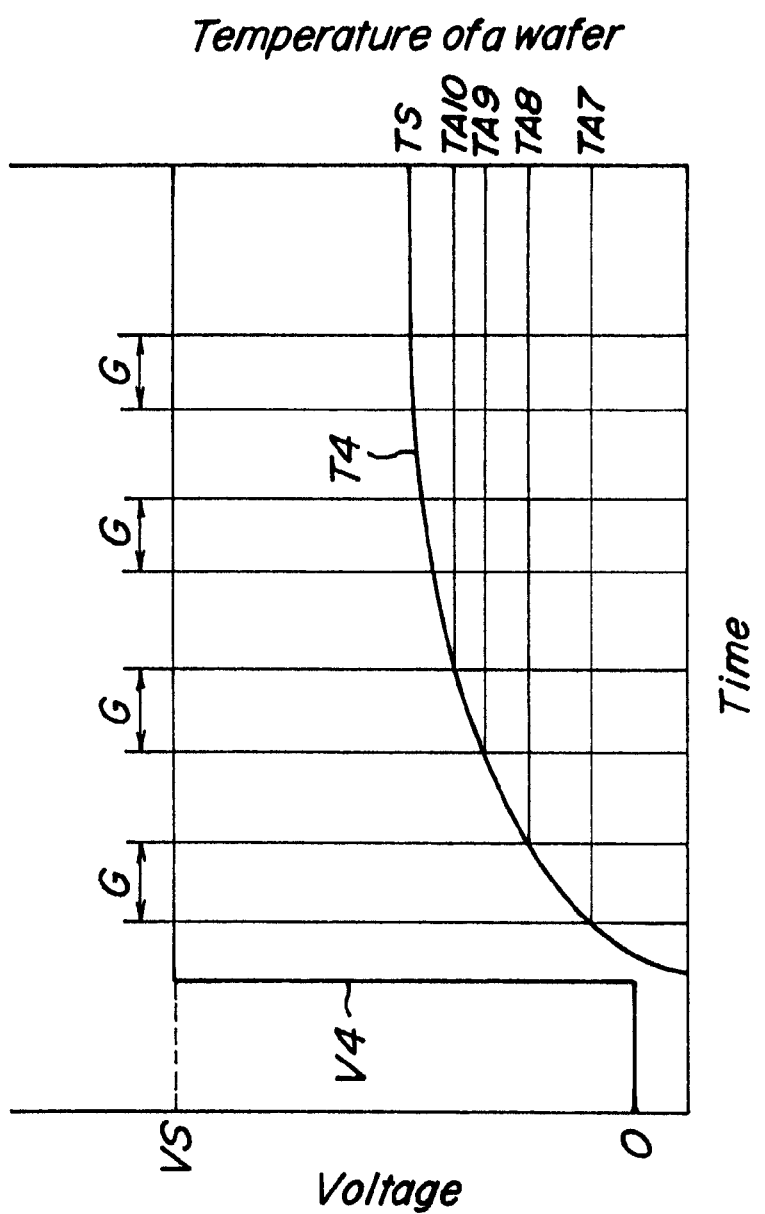
FIG. 4 is a graph showing, as an example, a voltage schedule V4 and a temperature schedule T4.

Moreover, the wafer can be slid to the attracting face by flowing a backside gas between the attracting face and the wafer, when applying the voltage with the electrostatic chuck. FIG. 4 schematically show an example of an applied voltage pattern V4 and a rising schedule of the wafer's temperature, as a function of time past. In this example, the desired voltage VS is applied from the beginning while the pulsed backside gas is flown intermittently during a period G. The wafer's temperature is smoothly increased during the period of the backside gas flowing. Then, the attracting power is decreased by the pressure of the backside gas, and thereby the wafer is slid relative to the attracting face and the stress is released.

If each of temperatures of the stress releasing steps is denoted as TA1 to TA10, respectively and the saturated temperature is denoted as TS, the temperature difference between the successive stress releasing steps and the difference between the temperature TA10 of the last stress releasing step and the saturated temperature TS are preferably not more than 50° C. or below, more preferably not more than 46° C. or below.

The above method according to the present invention may be carried out by the following semiconductor-manufacturing equipment. The equipment has an electrostatic chuck with an attracting face to set a semiconductor wafer, a power source to apply a voltage with the electrostatic chuck, a controlling system to change a voltage from the power source before the semiconductor wafer's temperature arrives at the saturated temperature.

This invention also relates to an equipment for manufacturing a semiconductor, comprising: an electrostatic chuck having an attracting face for setting a semiconductor wafer, a power supply for applying a voltage with the electrostatic chuck, a wafer's temperature-measuring means for measuring the temperature of the semiconductor wafer, and a controlling system which monitors and computes the temperature of the semiconductor wafer measured by the wafer's temperature-measuring means and transmits a controlling signal for controlling the power supply, based on the above computation.

This invention further relates to an equipment for manufacturing a semiconductor, comprising: an electrostatic chuck having an attracting face for setting a semiconductor wafer and a dummy wafer, a power supply for applying a voltage with the electrostatic chuck, a wafer's temperature-measuring means for measuring the temperature of the dummy wafer, and a controlling system which monitors and computes the temperature of the dummy wafer measured by the wafer's temperature-measuring means and transmits a controlling signal for controlling the power supply, based on the above computation.

Figure 5:
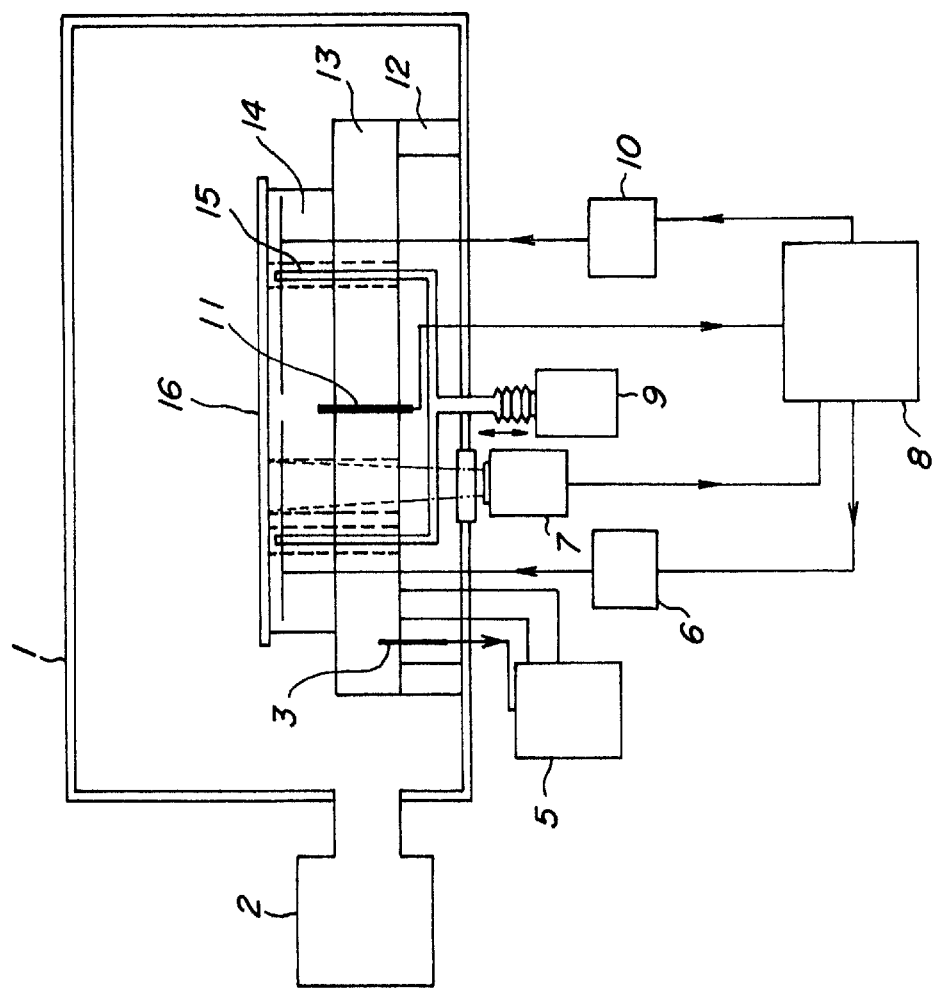
FIG. 5 is a block view schematically showing a preferred embodiment for carrying out a method of the present invention.

In FIG. 5, an electrostatic chuck 14 to stick a wafer 16 is installed on a supporting pedestal 12 through a heater 13 in a vacuum chamber 1. Then, a thermocouple 11 to measure the temperature of the electrostatic chuck 14 is set, and an infrared emission thermometer 7 as a wafer's temperature-measuring means for measuring the temperature of the wafer 16. Moreover, a lift pin 15 and a lift pin-elevating equipment 9 for attracting and releasing the wafer 16 on and from the electrostatic chuck 14.

The wafer 16 is conveyed to the vacuum chamber 1 and set onto the lift pin 15 in above position. Thereafter, the lift pin 15 is moved downwardly by the lift pin-elevating equipment 9 and thereby the wafer 16 is set onto the electrostatic chuck 14. The reference numeral "2" denotes a vacuum pump.

The heater 13 is worked by a heater controller 5, whereby the electrostatic chuck 14 is heated to a given temperature. The wafer is set onto an attracting face of the electrostatic chuck 14 and is stuck thereon by working electrostatic power sources 6 and 10. In this case, the temperature of the wafer is monitored by the infrared emission thermometer 7, the temperature of the electrostatic chuck 14 is monitored by the thermocouple 11, and thereafter the monitored data are transmitted to a controlling system 8 in a real-time. The controlling, as above mentioned, of the applied voltage with the electrostatic chuck and the wafer's temperature is carried out by working the controlling system 8.

After film-forming, the applied voltage with the electrostatic chuck is turn off, and the wafer 16 is released from the electrostatic chuck by moving upwardly the lift pin 15.

EXAMPLES

Example 1

By employing such an equipment as FIG. 5 and followed by such a voltage schedule as FIG. 1, a wafer is stuck. Then, the wafer was conveyed to a vacuum chamber in a pressure of $10^{-5}$ Torr. When the wafer's temperature TO just before attracting was measured by an infrared emission thermometer, the temperature was 246° C. The temperature of the electrostatic chuck was made to be 320° C. in stable and the wafer with a dimension of 8 inches was set onto its attracting face. In this case, a mirror face of the wafer was downward. Such pulsed voltage as shown in FIG. 1 was applied to an electrode inside the electrostatic chuck, provided that the VS was 300V, the applying period of the 300V pulsed voltage was 4 seconds, and the interval of the pulsed voltage was 1 second. The pulsed voltage was applied by 12 pulses, and thereafter the wafer was released from the electrostatic chuck.

When a number of particles on the wafer was measured by a wafer protractor (WM-1500 made by Topcon Co., Ltd), 1500 particles with not less than 0.2 $\mu$m were observed. Moreover, a wafer with a thermocouple (8 inches' dimension, 17 measuring points) was employed, and the temperature change of the wafer was measured by applying a voltage, followed by a similar process to the above mentioned. When a voltage of 300V is applied for 4 seconds, the wafer's temperature is increased by 20° C. as compared with that before attracting. When the voltage is not applied for 1 second, the wafer's temperature is not decreased. After the above process, the wafer's temperature is almost smoothly increased during voltage application and arrive at a saturated temperature of 307° C. The rise of the wafer's temperature during application of one pulsed voltage was not more than 20° C. or below.

Example 2

A wafer was set onto an attracting face of an electrostatic chuck, and was stuck thereon by applying a voltage in the same manner as Example 1. Hereupon, in applying the pulsed voltage of 300V, the period of the voltage was 5 seconds and the interval of the voltage was 1 second. Such a pulsed voltage was applied by 10 cycles, turned off, and thereafter the wafer was released. When a number of particles was measured in a similar way to Example 1, 1700 particles with not less than 0.2 $\mu$m were observed. Moreover, when a thermocouple-attached wafer was employed and the temperature change in each point of the wafer was measured, the temperature was smoothly increased as well as Example 1. The rise of the wafer's temperature during application of one pulsed voltage was not more than 35° C. or below and the difference between the wafer's temperature before attracting and its saturated temperature was 150° C.

Example 3

A wafer was stuck, released, and thereafter a number of particles on the wafer was measured in a similar way to Example 1. Hereupon, such applied voltage-schedule and a wafer's temperature-rising schedule as shown in FIG. 2 were employed, provided that VA1 was 100V, VS was 300V, and a voltage increasing rate of 300V from 100V was 20V/min. Then, the applying voltage was held at 300V for 1 minute. After the voltage was turned off and the wafer was released, a number of particles was measured by a similar way to Example 1. Consequently, 1650 particles with not less than 0.2 $\mu$m m were observed.

When a thermocouple-attached wafer was employed and the wafer's temperature change in each position thereof at applying the voltage was measured, the difference between the wafer's temperature and its saturated temperature was 60° C. After attracting, the wafer's temperature was smoothly increased to the saturated temperature for 10 minutes.

Example 4

A wafer was stuck, released, and thereafter a number of particles on the wafer was measured in a similar way to Example 1. Hereupon, such applied voltage-schedule and a wafer's temperature-rising schedule as shown in FIG. 3 were employed, provided that VA2 was 110V, VS was 300V, and an applying voltage was held at 300V for 1 minute. Then, 1800 particles with not less than 0.2 $\mu$m were observed.

When a thermocouple-attached wafer was employed and the wafer's temperature change in each position thereof at applying the voltage was measured, the wafer' temperature after 40 seconds from the beginning of the voltage application of 110V was higher by 58° C. than that before attracting. Switching the value of the voltage to 300V, the wafer's temperature was increased by 32° C. and reached the saturated temperature.

Example 5

A wafer was stuck, released, and thereafter a number of particles on the wafer was measured in a similar way to Example 1. Hereupon, such applied voltage-schedule and a wafer's temperature-rising schedule as shown in FIG. 4 were employed, provided that VS was 300V. Moreover, in this case, a backside gas was introduced for 1 second so that its pressure may be 70 Torr and evacuated at 1 second later after a voltage of 300V was applied. Then, this process of gas-introduction was repeated 20 times. The wafer was released at 1 minute later after applying the above voltage. 1900 particles with not less than 0.2 μm were observed.

The attracting power during introducing the backside gas of 70 Torr corresponds to that during applying a voltage of 110V in Example 4.

Comparative Example 1

A wafer was stuck, released, and thereafter a number of particles on the wafer was measured in a similar way to Example 1. Hereupon, such applied voltage-schedule and a wafer's temperature-rising schedule as shown in FIG. 4 was employed and a backside gas were not used. The wafer was released at 1 minute later after applying a voltage of 300V. 4500 particles with not less than 0.2 μm were observed. The temperature difference between before and after attracting was 69° C.

As above mentioned, according to the present invention, the particles, which occurs with the wafer's temperature rise after setting it onto the attracting face of the electrostatic chuck, can be reduced.

What is claim is:

1. A method for reducing particles from an electrostatic chuck, comprising:
   providing an electrostatic chuck with an attracting face,
   setting a wafer onto the attracting face of the electrostatic chuck in a state wherein the temperature of the wafer is lower than the temperature of the attracting face,
   attracting the wafer onto the attracting face by applying a voltage to the electrostatic chuck,
   releasing stress due to a difference of the heat expansion between the wafer and the electrostatic chuck by sliding the wafer relative to the attracting face before the temperature of the wafer arrives at a saturated temperature, and
   increasing the temperature of the wafer to a saturated temperature.

2. The method of claim 1, wherein the sliding of the wafer relative to the attracting face is controlled by the voltage to be applied to the electrostatic chuck.

3. The method of claim 2, wherein the voltage is a pulsed voltage.

4. The method of claim 2, wherein the voltage is increased stepwise to reach the saturated temperature.

5. The method of claim 2, wherein the voltage is increased continuously to reach the saturated temperature.

6. The method of claim 1, wherein the wafer is sliding relative to the attractive face by reducing an attracting power of the electrostatic chuck to the wafer through flowing a backside gas between the attracting face and the wafer when the voltage is applied to the electrostatic chuck.

7. The method of claim 1, wherein a difference between the saturated temperature and the temperature of the wafer in a last stress releasing step before the wafer reaches the saturated temperature is 50 °C. or below.

* * * * *